(12) United States Patent
Onoe et al.

(10) Patent No.: US 6,270,839 B1
(45) Date of Patent: Aug. 7, 2001

(54) DEVICE FOR FEEDING RAW MATERIAL FOR CHEMICAL VAPOR PHASE DEPOSITION AND METHOD THEREFOR

(75) Inventors: Atsushi Onoe; Ayako Yoshida; Kiyofumi Chikuma, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/621,739

(22) Filed: Jul. 21, 2000

(30) Foreign Application Priority Data

Aug. 20, 1999 (JP) .................................................. 11-233457

(51) Int. Cl.⁷ .................................................. C23C 16/00
(52) U.S. Cl. .................. 427/248.1; 118/726; 34/380; 34/493; 34/497; 34/510; 34/209; 34/211; 34/359
(58) Field of Search .................. 427/248.1; 118/726; 34/380, 493, 497, 510, 209, 211, 359

(56) References Cited

U.S. PATENT DOCUMENTS

| | | | |
|---|---|---|---|
| 2,792,438 | * 5/1957 | Dunn | 118/725 |
| 4,916,828 | * 4/1990 | Yamane | 34/364 |
| 4,947,790 | * 8/1990 | Gartner | 118/726 |
| 5,019,423 | * 5/1991 | Hiai | 427/248.1 |

* cited by examiner

*Primary Examiner*—Richard Bueker
(74) *Attorney, Agent, or Firm*—Sughrue, Mion, Zinn, Macpeak & Seas, PLLC

(57) ABSTRACT

A raw material feeding apparatus is provided for a film-forming apparatus in which a thin film is formed from a solid matter as a raw material during chemical vapor-phase deposition. The apparatus includes sub-containers each having an opening for introduction of a gas, an opening for discharge of a gas, a bottom, on which a solid raw material is spread between the inlet opening and the outlet opening, and a wall defining a gap, in which a gas being introduced and discharged is made to contact the solid raw material spread on the bottom while the gas is moved on the surfaces of the material. The apparatus also includes a raw material container for receiving and holding the sub-containers. The apparatus also includes a heating device for heating the raw material container, and carrier gas conveying tubes for introducing a carrier gas into the raw material container and including a passage communicated to the outlet openings of the sub-containers.

9 Claims, 6 Drawing Sheets

DEVICE FOR FEEDING RAW MATERIAL FOR CHEMICAL VAPOR PHASE DEPOSITION AND METHOD THEREFOR

BACKGROUND OF THE INVENTION

1. Field of the Invention

The present invention relates to a raw material feeding device for a film-forming apparatus for chemical vapor-phase deposition, and more particularly, to a raw material vaporization apparatus and a raw material feeding method for the film-forming apparatus, in which a thin oxide film is formed using a gas sublimated from a metalorganic compound as a raw material.

2. Description of the Related Art

There are known methods for forming a thin film made of ferroelectric oxide such as a sputtering method, a liquid phase epitaxial method, a sol-gel method and the like. As one of such methods of forming a thin oxide film, there is also a metalorganic chemical vapor-phase deposition (MOCVD) in which a high deposition rate and a step-coverage property are obtained and further an epitaxial growth is achieved.

In case that an oxide thin film of e.g., nonlinear optical materials is formed in the MOCVD apparatus, dipivaloyl methane (DPM) complexes are used for solid raw materials since such complexes can be sublimated with a comparatively high vapor pressure at a relatively high temperature, for example, 150 to 200° C.

FIG. 1 is a cross sectional view of a conventional raw material feeding device used in MOCVD apparatus. In the figure, the reference numeral 1 designates a container for a solid raw material, numeral 2 represents a bulk quantity of the solid raw material powder, numeral 3 represents a pair of mesh metal wires for supporting the solid raw material therebetween, numeral 4 represents an inlet conduit for a carrier gas, numeral 5 represents a flange, numeral 6 represents an outlet conduit for a mixture of the carrier gas and the sublimated metalorganic gas connected to a growth chamber, and numeral 7 represents an oven for heating the container.

As shown in FIG. 1, a pair of mesh stainless steel wires 3 hold the bulk solid raw material 2 and are placed in the raw material container 1. The container is heated by the oven 7 to a temperature at which the raw material can vaporize but does not decompose while a carrier gas such as argon (Ar) is introduced through the inlet conduit 4 into the container. The carrier gas passing through the solid raw material 2 carries the metalorganic gas sublimated from the solid raw material 2 as a gas mixture through the outlet conduit 6 and feeds the gas mixture into the growth chamber of the MOCVD apparatus.

In this way, the bulk of the solid raw material powder supported by the mesh metal wires is sublimated while the sublimated metalorganic gas is mixed with the carrier gas directly passing through the bulk material, whereby the gas mixture with the raw material is obtained for the MOCVD.

FIG. 2 shows an initial state of the bulk solid raw material powder interposed between the mesh metal wires 3 in the conventional raw material feeding device, and FIG. 3 shows a state of that bulk after a time of passage of the carrier gas therethrough. In the figures, the reference numeral 2 designates a solid raw material. In FIG. 2, arrow represent the carrier gas uniformly passing through the bulk 2 of the solid raw material powder at the beginning of feeding the gas mixture. In FIG. 3, numeral 21 represents holes, each of the holes penetrating the bulk 2 of the solid raw material powder and arrows in the figures indicate paths of the gas.

In the conventional device for feeding metalorganic gas, the gas mixture including the metalorganic gas at a predetermined density is maintained at a stable rate during the initial state of the bulk of the solid raw material powder under predetermined conditions, since the carrier gas is uniformly infiltrated into the fresh bulk 2 of the solid raw material powder and passes therethrough at the beginning, as seen from FIG. 2. However, after the bulk of the solid raw material powder is repeatedly used to pass the carrier gases through the bulk time after time, the carrier gas forms a plurality of holes 21 which penetrate the bulk 2 to facilitate passage of the gas as shown in FIG. 3. In this case, the sublimation of the material tends to occur mainly in internal surfaces of the holes 21 to consume the bulk of the solid raw material. This phenomenon causes uneven distributions of the passages of the carrier gas.

Furthermore, in addition to the above matter, the solid raw material generally progressively increases in grain size due to re-crystallization caused by the repeated heatings. This phenomenon remarkably promotes such uneven distributions of passages of the carrier gas with the elapse of time.

Therefore, the density of the raw material components in the gas mixture is lower than that of the initial state when the initial conditions for the gas mixture is maintained, so that the predetermined density of the metalorganic gas in the gas mixture becomes unstable with the lapse of time. As a result, the required thin film to be formed is thinner than expectation, so that the thin film becomes rough or uneven.

To make a thicker concentration of the supply of raw material, a measurement was made, in which the raw material held in the container is increased in quantity, or a plurality of raw material containers of the same type are connected together.

In the case where a powder solid raw material is held by wire meshes, it is not possible to obtain a thick raw material gas when the raw material is small in quantity. Also, the solid raw material decreases with the elapse of time during the use of the material, and becomes porous as compared with the bulk material in the early stage. Thus, the area of the material in contact with the carrier gas is varied so that the concentration of obtained raw material in the gas decreases gradually under a constant vaporization condition. Therefore, it is difficult to maintain a constant concentration in the supplied raw material gas.

OBJECT AND SUMMARY OF THE INVENTION

The present invention has been devised to solve the problems described above, and has as an object to provide a solid raw material feeding method and apparatus, in which it is possible to stably provide a gas, in which a solid raw material is mixed to an extent of saturated vapor pressures.

A raw material feeding apparatus according to the present invention is a device for feeding a gas sublimated from a solid raw material to a film-forming apparatus using chemical vapor-phase deposition. The device comprises:

sub-containers each having an inlet opening for introducing a gas into each of the sub-containers, an outlet opening for discharging the gas, a bottom on which a solid raw material is spread between the inlet and outlet openings, and a wall for defining a gap in conjunction with the bottom in which the introduced gas is moved on a surface of the solid raw material spread on the bottom while contacting the solid raw material;

a raw material container for accommodating and holding the sub-containers;

a heating device for heating the raw material container; and a device for introducing a carrier gas into the raw material container and including a passage communicating with the outlet openings of the sub-containers.

In an aspect of the present invention, the sub-containers comprise means by which the sub-containers are detachably joined to the raw material container.

In another aspect of the present invention, the sub-containers comprise means by which the sub-containers are joined together.

In a further aspect of the present invention, at least one of the sub-containers are joined together in such a manner that the carrier gas passes in series through the sub-containers.

In a still further aspect of the present invention, the wall defining the gap has a dispersion means for dispersing the gas, when introduced and discharged, on surfaces of the solid raw material.

In another aspect of the present invention, each of the sub-containers comprises a petri dish-shaped member defining the bottoms thereof.

A method of feeding a gas sublimated from a solid raw material to a film-forming apparatus using chemical vapor-phase deposition according to the invention comprises the steps of:

providing sub-containers each having an inlet opening for introducing a gas into each of the sub-containers, an outlet opening for discharging the gas, a bottom disposed between the inlet and outlet openings, and a wall for defining a gap in conjunction with the bottom;

spreading a solid raw material on the bottom of the sub-container; and introducing a carrier gas into the gap to move on a surface of the solid raw material spread on the bottom and contacting the solid raw material while heating the sub-containers so as to generate vaporized gas.

In an aspect of the present invention, the method further comprises a step of diffusing the carrier gas and vaporized gas on the solid raw material.

In another aspect of the present invention, the method further comprises a step of joining the sub-containers together in such a manner that the carrier gas passes in series through the sub-containers.

In the solid raw material feeding method and apparatus according to the invention, a solid raw material is spread and filled in the bottom of a sub-container i.e., cartridge, whereby a carrier gas can pass over the surfaces of the solid raw material without squeezing. Also, the method and apparatus are independent of the particle size of the solid raw materials and the path of the carrier gas is invariable, so that it is possible to obtain a stable gas feedings over a long term in which gas concentration is constant in the raw material contents of the carrier gas after passage through the device. Also, a raw gas having a high density can be obtained by arranging cartridges in a multi-stage and in series with respect to the carrier gas.

DETAILED DESCRIPTION OF THE PREFERRED EMBODIMENTS

Embodiments according to the present invention will be described hereinbelow with reference to the drawings.

Figure 1:
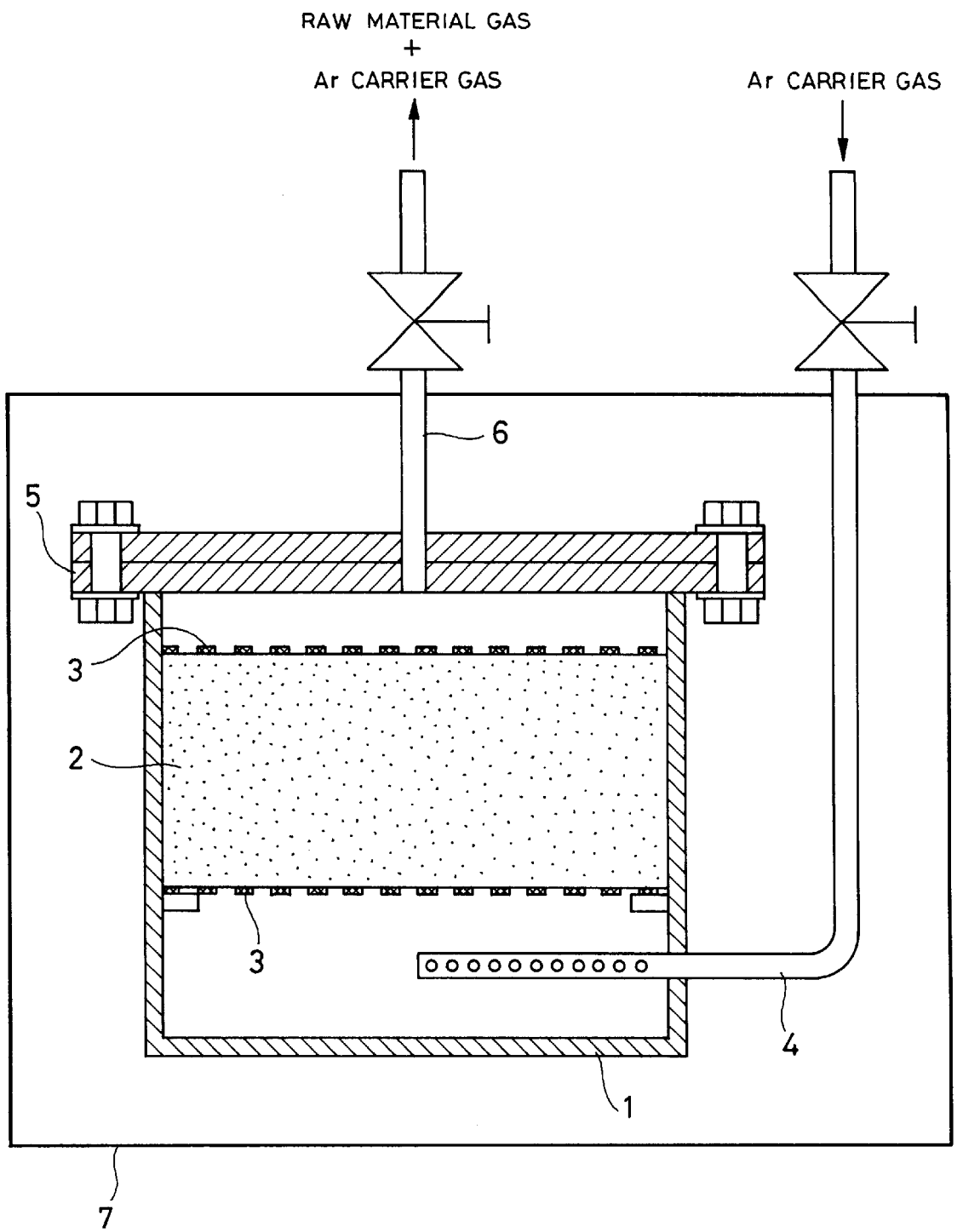
FIG. 1 is a schematic cross sectional view of the prior art raw material feeding device.
Figure 2:
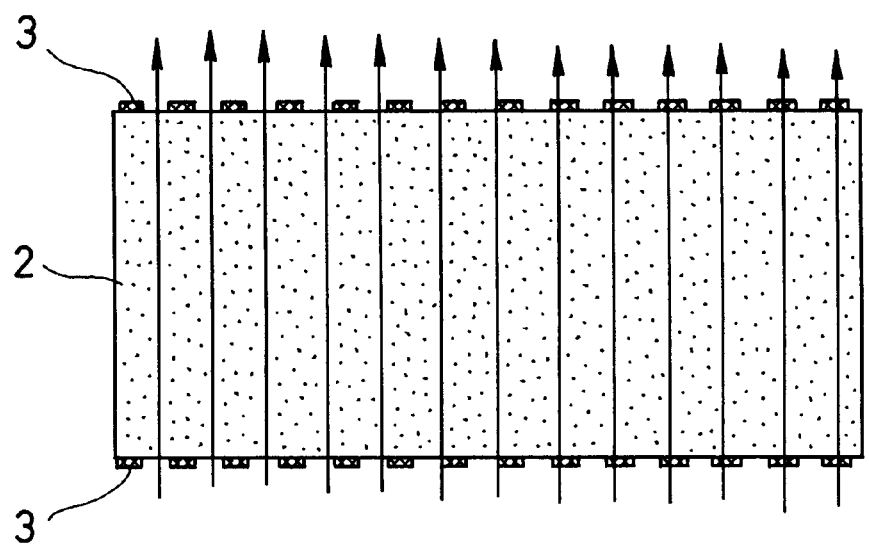
FIG. 2 is a schematic cross sectional view of a solid raw material, in an initial state, interposed between meshes in the prior art raw material feeding device.
Figure 3:
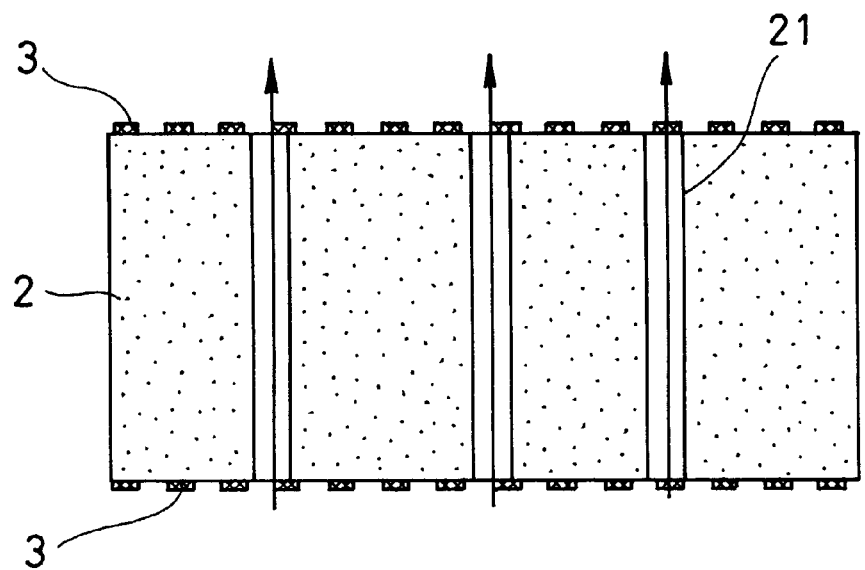
FIG. 3 is a schematic cross sectional view of a solid raw material, after passage of the carrier gas therethrough, interposed between meshes in the prior art raw material feeding device.
Figure 4:
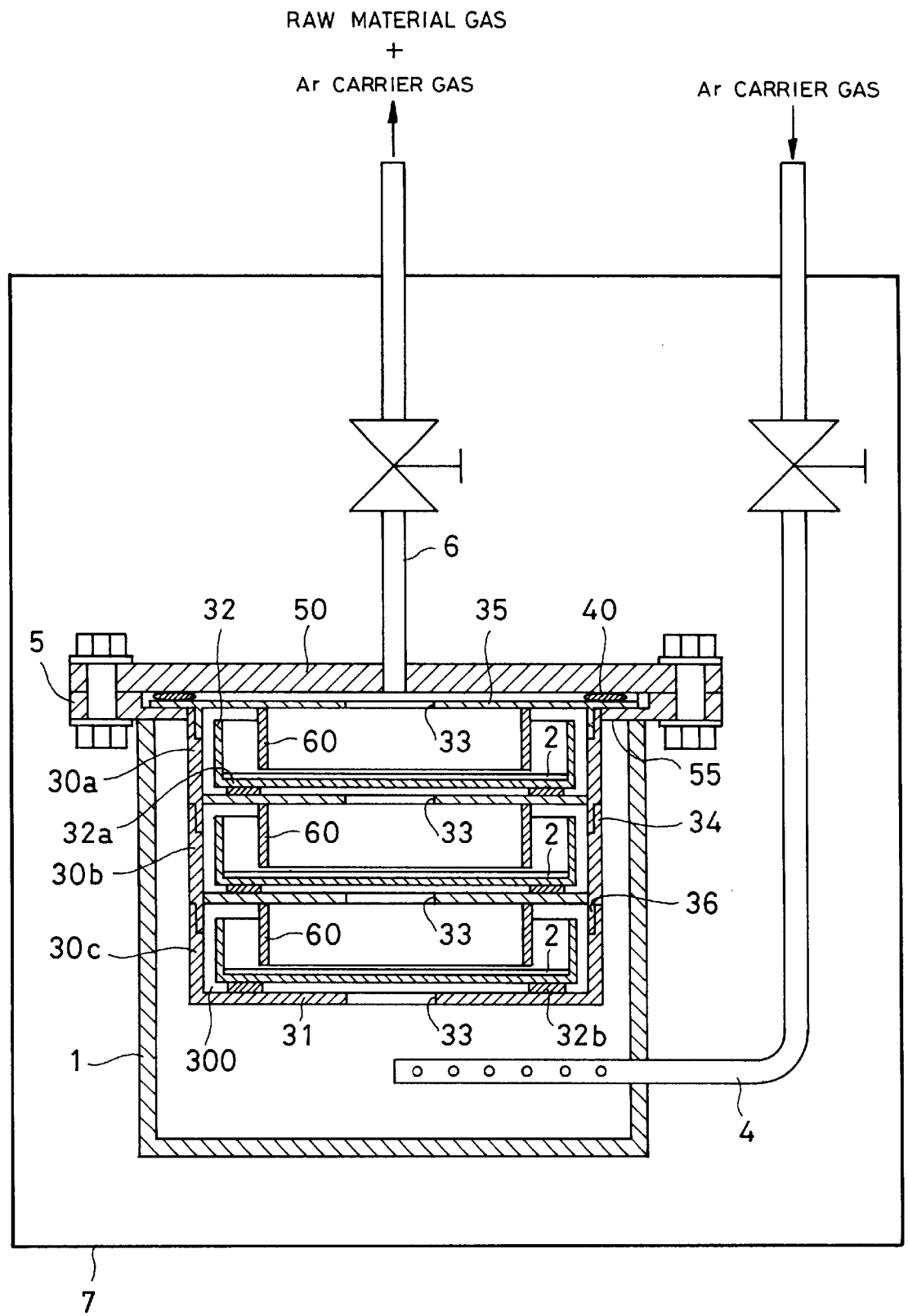
FIG. 4 is a schematic cross sectional view of a raw material feeding device of an embodiment according to the present invention.

FIG. 4 is a cross sectional view of a raw material feeding device, according to an embodiment, used in a MOCVD apparatus. In the figure, the reference numeral 1 designates a raw material container; numeral 2 represents a solid metalorganic compound raw material for MOCVD; numerals 30a, 30b and 30c represent sub-containers for storing raw materials, that is, raw material storage cartridges; numeral 4 represents a carrier gas inlet conduit communicated into the raw material container 1; numeral 5 represents a flange of the raw material container 1; numeral 6 represents an outlet conduit communicated to the raw material storage cartridge and for a gas, in which a raw material gas is mixed; and numeral 7 represents an oven for heating. A material for use in making the raw material feeding apparatus according to the embodiment, such as the raw material container, the raw material storage cartridges, is selected from substances inert to a metalorganic compound raw material, such as stainless steel.

In the raw material feeding apparatus according to the embodiment, the raw material storage cartridges 30a, 30b and 30c are provided in plural stages, for example, three stages within the raw material container 1 and connected to one another. A petri dish-shaped pan 32 made of stainless steel is placed on the bottom 31 of each of the cylindrical-shaped raw material storage cartridges. A powder raw material 2 is placed on the flat bottom 32a of the petri dish 32 which measures a uniform depth. Generally, the solid raw material is in the form of powder, but may be in the form of a disk obtained when the material is once melt and solidified. In the latter case, while the raw material becomes small in surface area, gasification proceeds on the surfaces thereof, so that the raw material remains constant in surface area until the petri dish bottom is exposed. As a result, a gas having a constant concentration can be supplied for a long time, so that the raw material is efficiently used.

The petri dish 32 is removably placed at the center of the bottom 31 of each of the raw material storage cartridges through a spacer 32b. A gas passage 300 is defined between the bottom 32a of and external side surfaces of side walls of the petri dish 32 and the bottom 31 of internal side surfaces of side walls of the raw material storage cartridge. Further, an opening 33, through which a gas is introduced and discharged, is provided at the center of the bottom 32 of the raw material storage cartridge. This opening 33 thus serves an inlet or outlet opening. An upper threaded portion 34 is provided on an upper peripheral edge of each of the raw material storage cartridges. An opening 33 for discharge of a gas is provided at the center of a circular-shaped lid 35 of the respective cartridges. The raw material storage cartridge 30a and the lid 35 are made to threadedly engage with each other through the upper threaded portion 34 of the cartridge and a lower threaded portion 36 of the lid 35. Because the lid 35 is larger in outer diameter than the raw material storage cartridge 30a, an outer edge of the lid 35 is structured to be capable of engaging with a seat 55 on the flange 5 of the raw material container 1. That is, the raw material storage cartridges are detachably joined to the raw material container 1 by means of the outer edge of the lid 35. In this way, the raw material feeding device is constructed in such a manner that replacement is easily performed with respect to the raw material storage cartridges joined together, each of the raw material storage cartridges and each petri dish 32.

The raw material storage cartridge 30a is provided at a lower peripheral edge with a lower threaded portion 36. Thus, the lower threaded portion 36 of the raw material storage cartridge 30a threadedly engages with the upper threaded portion 34 of the raw material storage cartridge 30b. Likewise, the raw material storage cartridge 30b is provided at its lower peripheral edge with a lower threaded portion 36, which threadedly engages with the upper threaded portion 34 of the raw material storage cartridge 30c in the lowermost stage. In this way, the raw material storage cartridges are provided with the lids thereof and the upper and lower threaded portions 34, 36 as a portion for joining the raw material storage cartridges together.

When a solid raw material is to be charged into the vaporization apparatus, the material is uniformly placed on the petri dish 32 of each of the raw material storage cartridges, and the storage cartridges and the lids 35 are made to threadedly engage with each other in a sequential manner. Thus, the united raw material storage cartridges are fixed to the raw material container 1 in such a manner that the outer edge of the lid 35 is engaged by the seat 55 of the flange 5 on the raw material container, and a gasket 40 is placed in position and the lid is fastened to a container lid 50, in which the gas outlet conduit 6 is provided, by bolts. In this way, the raw material container can be opened and closed by using bolts or the like, so that the raw material can be replaced together with a respective cartridge. Further, the raw material container can be shut off completely from the outside air by means of the gasket and the valves provided on the carrier gas inflow and outflow portions.

The petri dishes 32 are disposed within the raw material storage cartridges 30 so that the carrier gas flows on the raw material received in the cartridges at all the stages all over from the peripheries of the petri dishes toward the centers thereof and reversely, and the cartridges are joined together so that the carrier gas flows in series through the raw material storage cartridges. Because the outside walls on the bottoms of and the lids of the raw material storage cartridges thus joined define spaces or gaps, the carrier gas can contact the raw material while flowing on the surfaces of the raw material spread on the bottoms of the raw material storage cartridges, that is, the bottoms of the petri dishes, which is raised from the bottoms of the raw material storage cartridges.

With such an arrangement, the high density raw gas having a constant concentration can be provided over a long period of time in which the constant concentration corresponds to the total area of the bottoms and the number of the petri dishes in the raw material storage cartridges. This is because vaporization or sublimation proceeds from the surface portions of the raw material on the petri dishes and so the surface area of the raw material remains constant until the bottom surfaces of the petri dishes are exposed as the raw material is consumed.

In this embodiment, dispersion plates 60 are inserted into the carrier gas passages, i.e., gaps each defined by the outer side wall of the bottom of the raw material storage cartridges in order to diffuse the passing gas, i.e., carrier gas and vaporized gas on the raw materials of the petri dishes within the raw material storage cartridges at all the stages. The dispersion plates 60 extend from the lid 35 and the bottoms 31 of the cartridges so as not to contact the solid raw materials 2, thereby making the carrier gas flow on the surfaces of the solid raw materials "licking" them.

The cartridges are provided in a multi-stage way within a single raw material container, which saves space as compared with an arrangement in which a plurality of raw material containers are connected to one another in series. Therefore, an oven serving as a heating device can be smaller to be serviceable, and the number of parts can be reduced.

Figure 5:
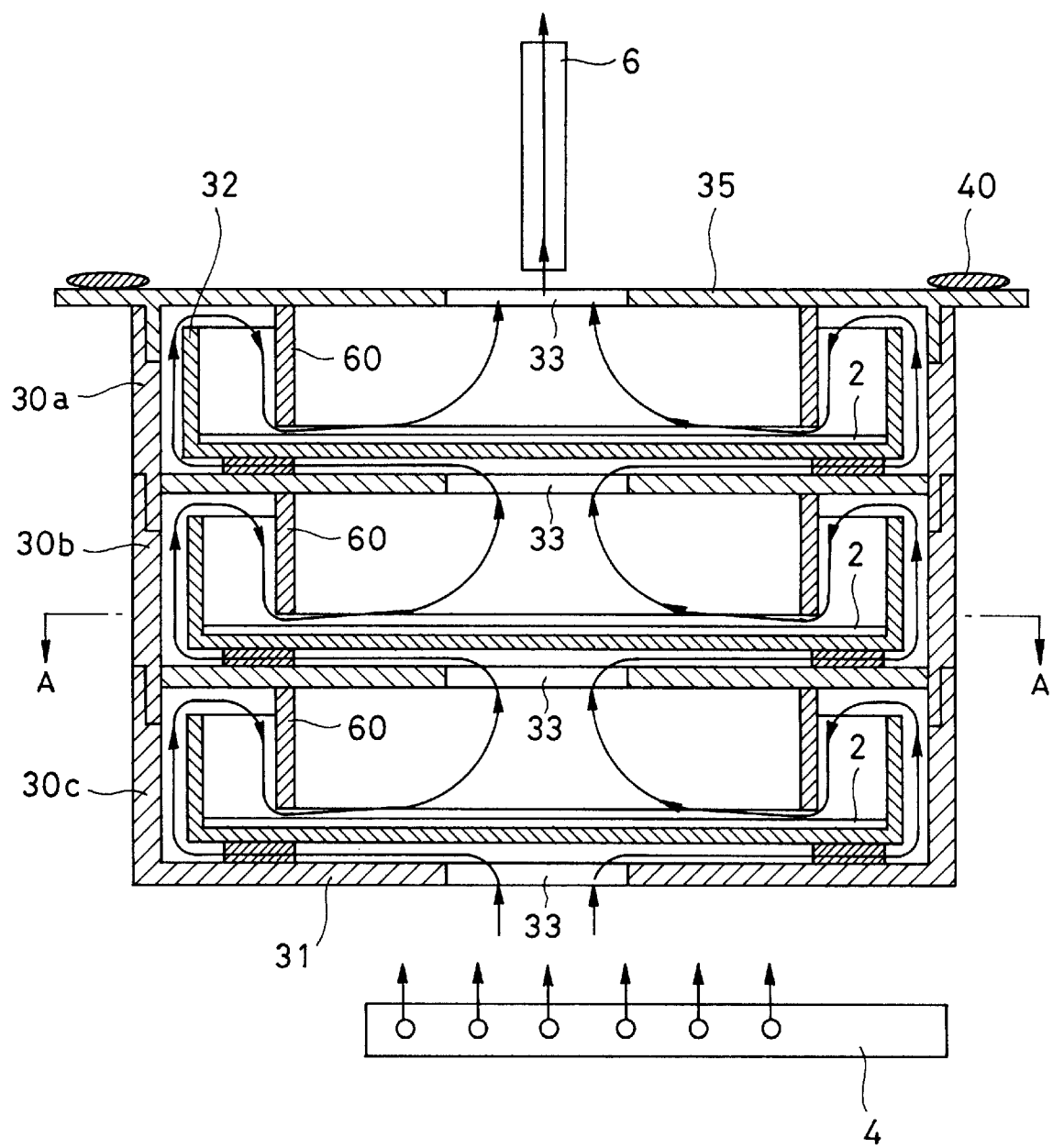
FIG. 5 is a schematic cross sectional view of a cartridge in the raw material feeding device of an embodiment according to the present invention.

As shown in FIG. 5, the raw gas flows such that the carrier gas enters from the opening 33 provided on the bottom of the lowermost stage raw material storage cartridge 30c to flow between the cartridge and the petri dish to flow on the surface of the raw material spread on the petri dish from the outer peripheral portion thereof. At this time, the dispersion plate 60 provided within the petri dish in a ring-shaped configuration causes the gas to be diffused and thereby sufficiently contact the surface of the raw material.

The gas having taken in the vaporized raw material at the lower stage cartridge is introduced from the opening 33 provided on the bottom of the middle stage raw material storage cartridge 30b, and advances in the same manner as described above. Finally, the gas advances in the same manner as described above to be fed to a reaction apparatus via the outlet conduit 6 on the lid 35.

In the embodiment, the raw material flows in series through the raw material storage cartridges stacked in three stages, but the storage cartridges in two or more stages are also sufficient effective. Also, it is possible to use one raw material storage cartridge or at least four raw material storage cartridges depending upon the raw gas concentration.

Figure 6:
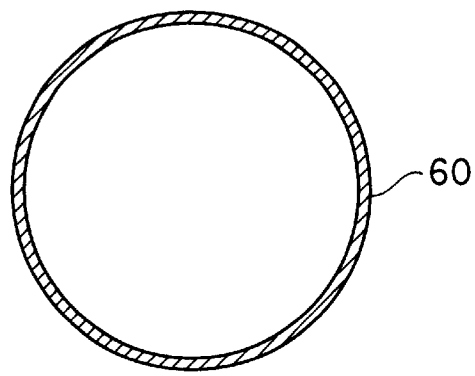
FIG. 6 is a cross sectional view of a dispersion plate in the cartridge in the raw material feeding device taken along the line A—A in FIG. 5.
Figure 7:
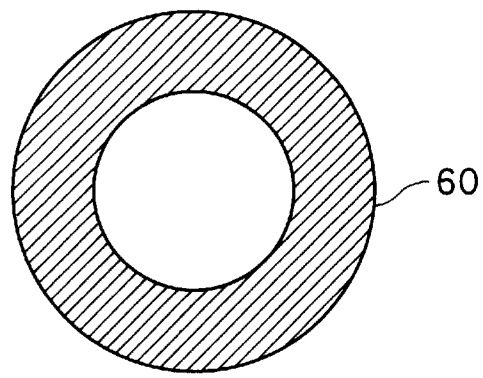
FIGS. 7 and 8 are cross sectional views each showing a dispersion plate in the cartridge in a raw material feeding device of another embodiment according to the present invention.
Figure 8:
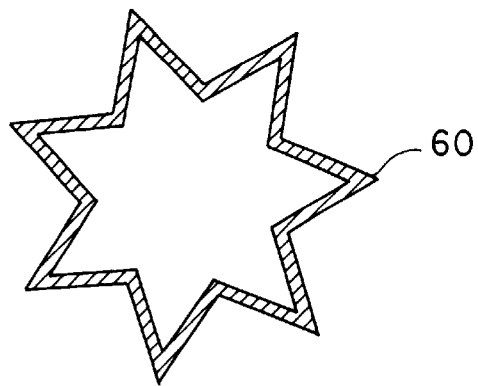

While in the embodiment, the dispersion plates 60 in the respective stage raw material storage cartridges are of annular shape and small in thickness, as shown in FIG. 6, the plates may have an increased in thickness, as shown in FIG. 7, to have a large area at free ends thereof so as to make laminar flow of the gas parallel to the raw material surfaces. Further, even when the dispersion plates 60 are polygonal-shaped or star-shaped, as shown in FIG. 8, other than circular-shaped in cross section, the gas dispersion effect can be obtained.

Figure 9:
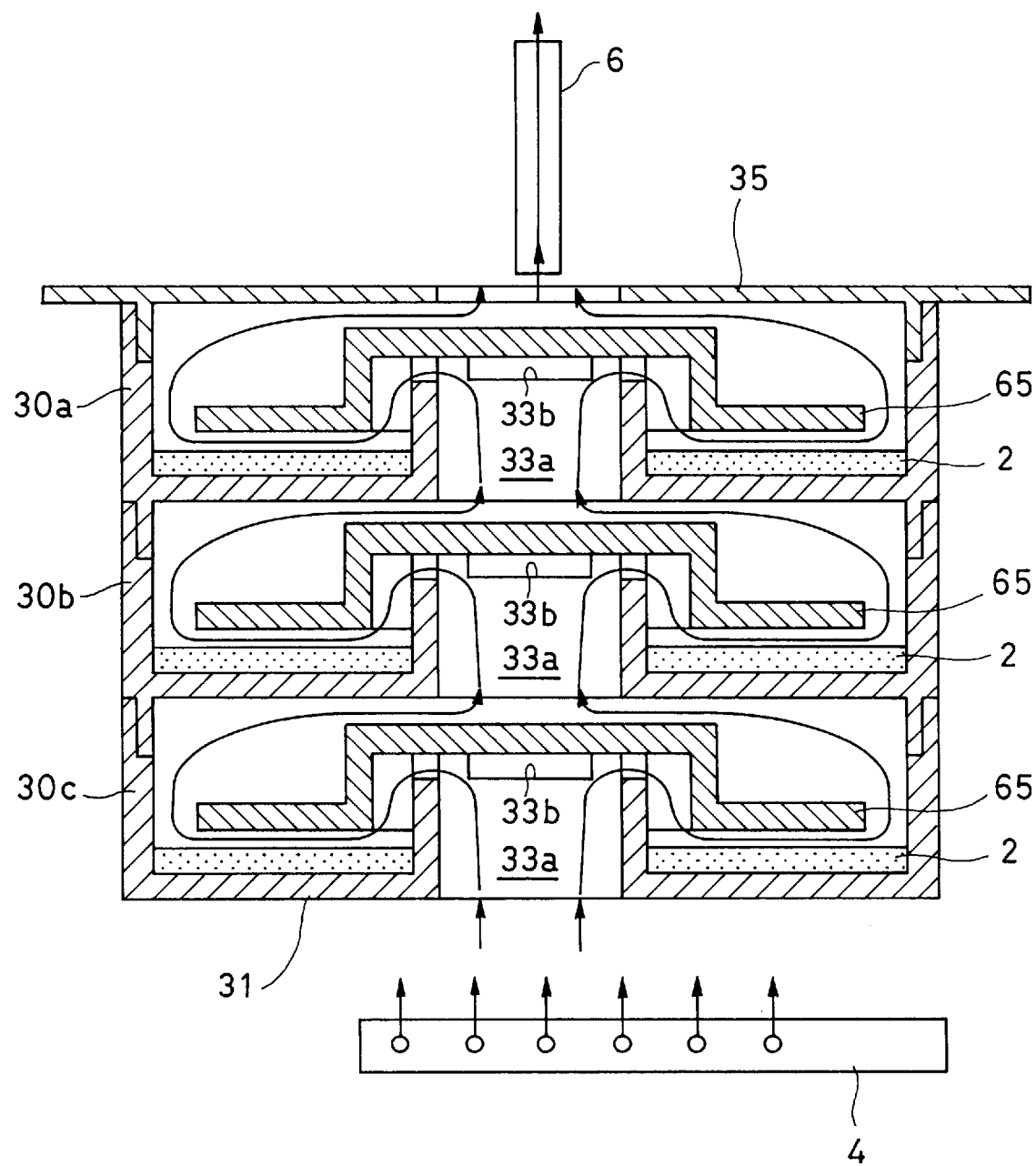
FIG. 9 is a schematic cross sectional view of a cartridge in a raw material feeding device of another embodiment according to the present invention.

Instead of providing the respective petri dishes for spreading the solid raw materials thereon, in another embodiment shown in FIG. 9, raw material storage cartridges 30a, 30b and 30c are usable which permit the solid raw materials to be spread directly on bottoms thereof respectively. The raw material storage cartridges 30a, 30b and 30c can be provided to be connected together in series. Each raw material storage cartridge is fabricated in the form of a chiffon cake mold to have the solid raw material placed uniformly on the annular-shaped bottom thereof. A cylindrical opening 33a is provided to project upward from the bottom in a chimney pipe fashion, and a plurality of notches 33b are provided on the upper peripheral edge of the cylinder. Circular dispersion plate 65 in the form of a hat is held on the top end of each cylindrical opening 33a. The gas entering through notches 33b on the hat crown portions of the circular plates 65 flows below the hat brim portions of the circular plates 65 in laminar flow to advance while making contact the surfaces of the solid raw materials 2. In this manner, the carrier gas is made to flow all over the raw materials stored in the cartridges at the respective stages from centers of the bottoms toward the peripheries thereof, so that utilization of the raw materials is made more effective. In addition, with the embodiment, the insides of the side surfaces of the circular plates 65 exhibit adequate gas dispersion effects even when the hat brim portions are omitted from the circular plates 65 i.e., a cap-shaped dispersion circular plate can be employed.

What is claimed is:

1. A raw material feeding apparatus for feeding a gas sublimated from a solid raw material to a film-forming apparatus using chemical vapor-phase deposition, the device comprising:

sub-containers each having an inlet opening for introducing a gas into each of the sub-containers, an outlet opening for discharging the gas, a bottom on which a solid raw material is spread between the inlet and outlet openings, and a wall for defining a gap in conjunction with the bottom in which the introduced gas is moved on a surface of the solid raw material spread on the bottom while contacting the solid raw material;

a raw material container for accommodating and holding the sub-containers;

a heating device for heating the raw material container; and a device for introducing a carrier gas into the raw material container and including a passage communicating with the outlet openings of the sub-containers.

2. A raw material feeding apparatus according to claim 1, wherein the sub-containers comprise means by which the sub-containers are detachably joined to the raw material container.

3. A raw material feeding apparatus according to claim 1, wherein the sub-containers comprise means by which the sub-containers are joined together.

4. A raw material feeding apparatus according to claim 1, wherein at least one of the sub-containers are joined together in such a manner that the carrier gas passes in series through the sub-containers.

5. A raw material feeding apparatus according to claim 1, wherein the wall defining the gap has a dispersion means for dispersing the gas, when introduced and discharged, on surfaces of the solid raw material.

6. A raw material feeding apparatus according to claim 1, wherein each of the sub-containers comprises a petri dish-shaped member defining the bottoms thereof.

7. A method of feeding a gas sublimated from a solid raw material to a film-forming apparatus using chemical vapor-phase deposition, the method comprising the steps of:

providing sub-containers each having an inlet opening for introducing a gas into each of the sub-containers, an outlet opening for discharging the gas, a bottom disposed between the inlet and outlet openings, and a wall for defining a gap in conjunction with the bottom;

spreading a solid raw material on the bottom of the sub-container; and introducing a carrier gas into the gap to move on a surface of the solid raw material spread on the bottom and contacting the solid raw material while heating the sub-containers so as to generate vaporized gas.

8. A method according to claim 7 further comprising a step of diffusing the carrier gas and vaporized gas on the solid raw material.

9. A method according to claim 7 further comprising a step of joining the sub-containers together in such a manner that the carrier gas passes in series through the sub-containers.

* * * * *